United States Patent
Matamura et al.

(10) Patent No.: US 11,411,543 B2
(45) Date of Patent: Aug. 9, 2022

(54) POWER EFFICIENCY IN AN AUDIO PLAYBACK PATH

(71) Applicant: Analog Devices International Unlimited Company, Limerick (IE)

(72) Inventors: Atsushi Matamura, Tokyo (JP); Abhishek Bandyopadhyay, Winchester, MA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/030,681

(22) Filed: Sep. 24, 2020

(65) Prior Publication Data

US 2021/0091739 A1    Mar. 25, 2021

Related U.S. Application Data

(60) Provisional application No. 62/905,324, filed on Sep. 24, 2019.

(51) Int. Cl.
*H03G 3/00* (2006.01)
*H03G 3/30* (2006.01)
*G06F 3/16* (2006.01)

(52) U.S. Cl.
CPC ........... *H03G 3/3005* (2013.01); *G06F 3/165* (2013.01)

(58) Field of Classification Search
CPC ....................................................... H03G 3/00
See application file for complete search history.

(56) References Cited

U.S. PATENT DOCUMENTS

| | | | |
|---|---|---|---|
| 8,649,529 B2 * | 2/2014 | Klefenz | G01S 3/809 381/92 |
| 8,890,608 B2 | 11/2014 | Sahandiesfanjani et al. | |
| 10,367,460 B2 | 7/2019 | Berkhout | |
| 11,070,183 B1 * | 7/2021 | Prior | H03G 7/007 |
| 2013/0226593 A1 * | 8/2013 | Magnusson | H04N 5/765 704/276 |
| 2015/0008962 A1 * | 1/2015 | Blyth | H03F 3/68 327/59 |
| 2017/0243598 A1 * | 8/2017 | Mani | H03G 3/3005 |
| 2017/0374459 A1 * | 12/2017 | Satoskar | H04R 3/04 |
| 2018/0351515 A1 * | 12/2018 | Lesso | H03F 1/3264 |
| 2018/0352328 A1 * | 12/2018 | Morgan | G10L 21/034 |
| 2019/0007011 A1 | 1/2019 | Berhkout | |
| 2020/0036352 A1 * | 1/2020 | Zhu | H03G 3/3005 |
| 2020/0044628 A1 * | 2/2020 | Das | H03G 3/3005 |

OTHER PUBLICATIONS

Bandyopadhyay et al., A 120dB-SNR 100dB-THD+N 21.5mW/Channel Multibit CT ΔΣ DAC, ISSCC 2011, Session 27, Oversampling Converters, 27.2, 3 pages.

* cited by examiner

*Primary Examiner* — Olisa Anwah

(57) ABSTRACT

Systems and methods are provided for circuit configurations that maintain audio playback performance while reducing power consumption. In particular, a gain for a current analog-to-digital converter in an audio playback path is adjusted based on an amplitude of the input signal. Additionally, systems and methods are provided for transitioning between a modes of operation for large signals and mode of operation for small signals.

20 Claims, 10 Drawing Sheets

POWER EFFICIENCY IN AN AUDIO PLAYBACK PATH

CROSS REFERENCE TO RELATED APPLICATIONS

This application is related to and claims the benefit of priority under 35 U.S.C. § 119(e) to U.S. Provisional Patent Application No. 62/905,324 entitled, "Improving Power Efficiency in an Audio Playback Path" filed on Sep. 24, 2019, which is hereby incorporated by reference in its entirety.

FIELD OF THE DISCLOSURE

The present invention relates to playback circuits, and, more specifically, to audio playback circuits.

BACKGROUND

Devices, such as class AB drivers, modulators, converters, and amplifiers, can be used in audio devices such as speakers and headphone drivers. Most of these applications are battery driven, and thus power consumption is an important parameter. These devices also need to meet high performance in terms of signal-to-noise ratio (SNR) and total harmonic distortion (THD). Typically, these applications have different modes of operation, such that one mode can be performance optimized and another can be power consumption optimized.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY

Systems and methods are provided for circuit configurations that maintain audio playback performance while reducing power consumption. Additionally, systems and methods are provided for transitioning between a modes of operation for large signals and mode of operation for small signals.

According to one aspect, an audio playback circuit includes a plurality of digital-to-analog converters (I-DACs) configured to receive an analog signal, a plurality of resistors coupled to an output from the plurality of I-DACs, and a gain processing module configured to determine, based on an input signal, a gain for each of the plurality of I-DACs and a resistance of each of the plurality of resistors, wherein the input signal is processed to generate the analog signal. In some examples, the I-DACs are current mode I-DACs and in some examples, the I-DACs can be voltage mode I-DACs or charge mode I-DACs. In some examples I-DACs can be current steering I-DACs, or can include resistances and/or capacitances.

In some implementations, the gain processing module is configured to detect a change in amplitude of the input signal, and wherein the gain processing module is configured to decrease the gain for each of the plurality of I-DACs when an input signal amplitude is large and to increase the gain for each of the plurality of I-DACs when an input signal amplitude is small. In some examples, when a decrease in amplitude is detected, the gain processing module is configured to maintain the gain for each of the plurality of I-DACs for a selected period of time. In some examples, the gain processing module is configured to decrease the resistance of each of the plurality of resistors when the input signal amplitude is small.

In some implementations, each of the plurality of I-DACs includes a plurality of cells, and the gain processing module increases a number of the plurality of cells that are active in each of the plurality of I-DACs to increase the gain of the plurality of I-DACs. In some implementations, the circuit includes a feedback loop between the plurality of resistors and the plurality of I-DACs. In some implementations, the circuit includes a quantizer coupled to a playback circuit output, and the quantizer has a quantizer gain, and the quantizer gain is related to the gain for each of the plurality of I-DACs. In some implementations, the gain processing module is further configured to use automatic gain control to adjust the gain for each of the plurality of I-DACs.

According to another aspect, a method for processing signals in an audio playback path, includes receiving an input signal at a playback path input, determining, at a gain processing module, a gain for a current analog-to-digital converter (I-DAC) based on an amplitude of the input signal, converting the input signal to an analog signal, and processing the analog signal at the I-DAC.

In some implementations, the method includes detecting a change in the amplitude of the input signal. In some implementations, the method includes decreasing the gain of the I-DAC when an increase in the amplitude of the input signal is detected.

In some implementations, the method includes increasing the gain of the I-DAC when a decrease in the amplitude of the input signal is detected. In some implementations, the method includes maintaining the gain of the I-DAC for a selected period of time when the decrease in the amplitude of the input signal is detected. In some implementations, the method includes adjusting a resistance of a resistor coupled to an output of the I-DAC, wherein adjusting the resistance includes decreasing the resistance when a decrease in the amplitude of the input signal is detected. In some examples, determining a gain of the I-DAC includes determining a number of cells in the I-DAC that are active, wherein increasing the number of cells that are active increases the gain of the I-DAC. In some implementations, the method includes adjusting a quantizer gain based on the gain of the I-DAC.

The drawings show exemplary digital Class D driver circuits and configurations. Variations of these circuits, for example, changing the positions of, adding, or removing certain elements from the circuits are not beyond the scope of the present invention. The illustrated playback circuits, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

Systems and methods are provided for circuit configurations that maintain audio playback performance while reducing power consumption. In particular, a gain for a current digital-to-analog converter in an audio playback path is adjusted based on an amplitude of the input signal. Additionally, systems and methods are provided for transitioning between a modes of operation for large signals and mode of operation for small signals.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Figure 1:
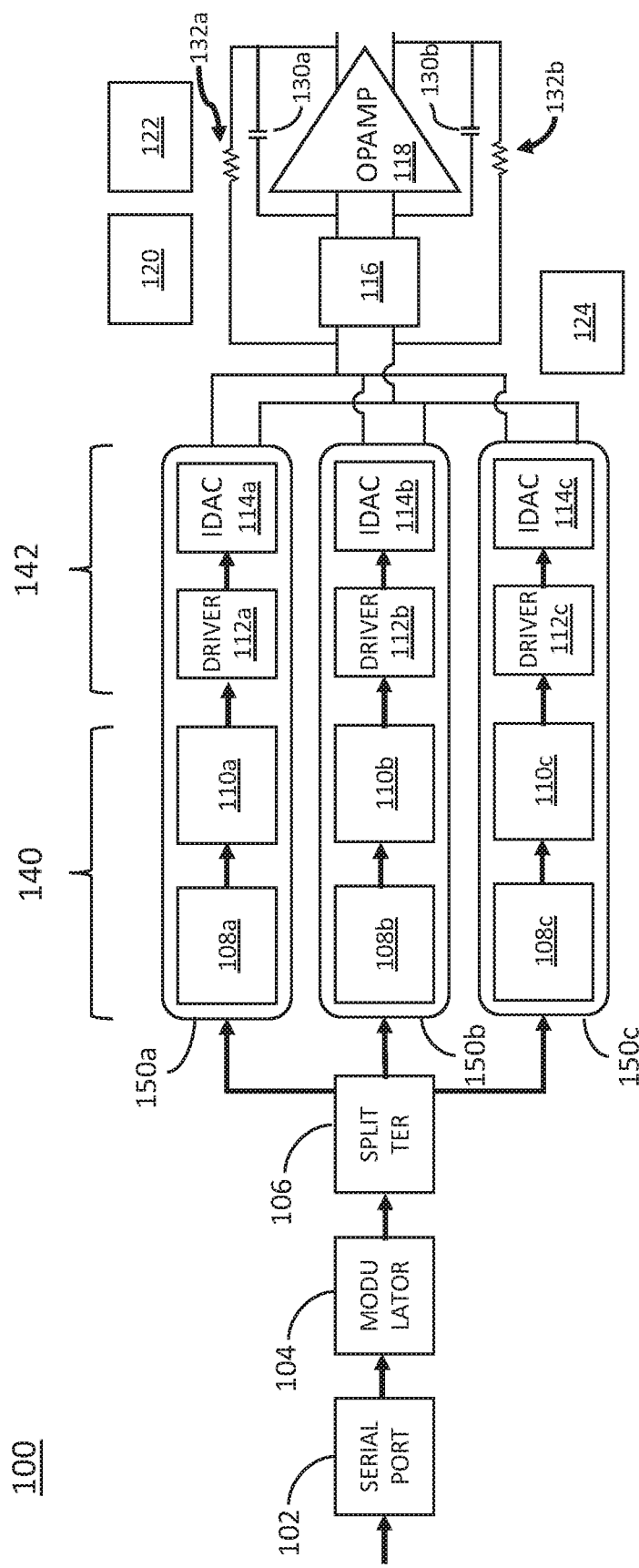
FIG. 1 depicts an audio playback path, according to various embodiments of the disclosure.

FIG. 1 depicts an audio playback path 100 including headphone or speaker drivers. The audio playback path 100 includes a serial port and interpolator 102, a modulator 104, and a noise-shaping splitter 106. An input signal is input to the serial port and interpolator 102. In various examples, the input signal includes multiple samples and bus widths. In one example, the input signal includes 24 bit input. The input signal is interpolated and input to the modulator 104. In some examples, the interpolation filter uses canonical signed digit arithmetic, and thus has low power consumption. In some examples, the modulator 104 is a second order modulator. In some examples, the modulator 104 is an eight bit modulator. The modulator output is input to the noise-shaping splitter 106. The noise shaping splitter 106 splits the signal into three parallel processing lines, and outputs a first sample set to a first line 150a, a second sample set to a second line 150b, and a third sample set to a third line 150c.

Each of the first 150a, second 150b, and third 150c parallel processing lines includes a sign-magnitude conversion element 108a, 108b, 108c, a rotational scrambler 110a, 110b, 110c, an I-DAC driver 112a, 112b, 112c, and an I-DAC 114a, 114b, 114c. In some examples, the I-DACs 114a, 114b, 114c are 2-level I-DACs, and in some examples, the I-DACs 114a, 114b, 114c are 3-level DACs. Note that the signal is a digital signal through to the rotational scrambler (section 140), which outputs a digital signal to the I-DAC driver 112a, 112b, 112c. According to various implementations, the audio playback path 100 depicts a 1st-order noise shaped segmentation technique. In some examples, the sign-magnitude conversion elements 108a, 108b, 108c perform sign magnitude thermometer code conversion. Following the conversion elements 108a, 108b, 108c, the one or more of the scramblers 110a, 110b, 110c apply individual discrete element modeling (DEM) to the signals in one or more of the respective parallel processing lines 150a, 150b, 150c. In various implementations, the DEM is rotational in nature. In some examples, the DEM is first order DEM, and in some examples, the DEM is higher order DEM such as second order DEM, third order DEM, or higher.

The outputs from the first 150a, second 150b, and third 150c parallel processing lines are input to ISI free switching element 116. The outputs are also connected to parallel resistors 132a, 132b connected to the playback line 100 output. The switching element 116 output is input to an operational amplifier 118. On the right, the operational amplifier 118 and the resistors 132a, 132b dominate the noise contributions following the first 150a, second 150b, and third 150c parallel lines. The audio playback path 100 also includes an I-DAC bias generator 120, a bandgap element 122, and an ISI free clock generation 124. According to various implementations, the playback path 100 includes one or more elements described herein. The opamp 118 and resistors 132a and 132b constitute a current to voltage converter which translate the overall current (provided by the current cells in the IDACs 214a, 214b, 241c) to an output voltage.

Figure 2:
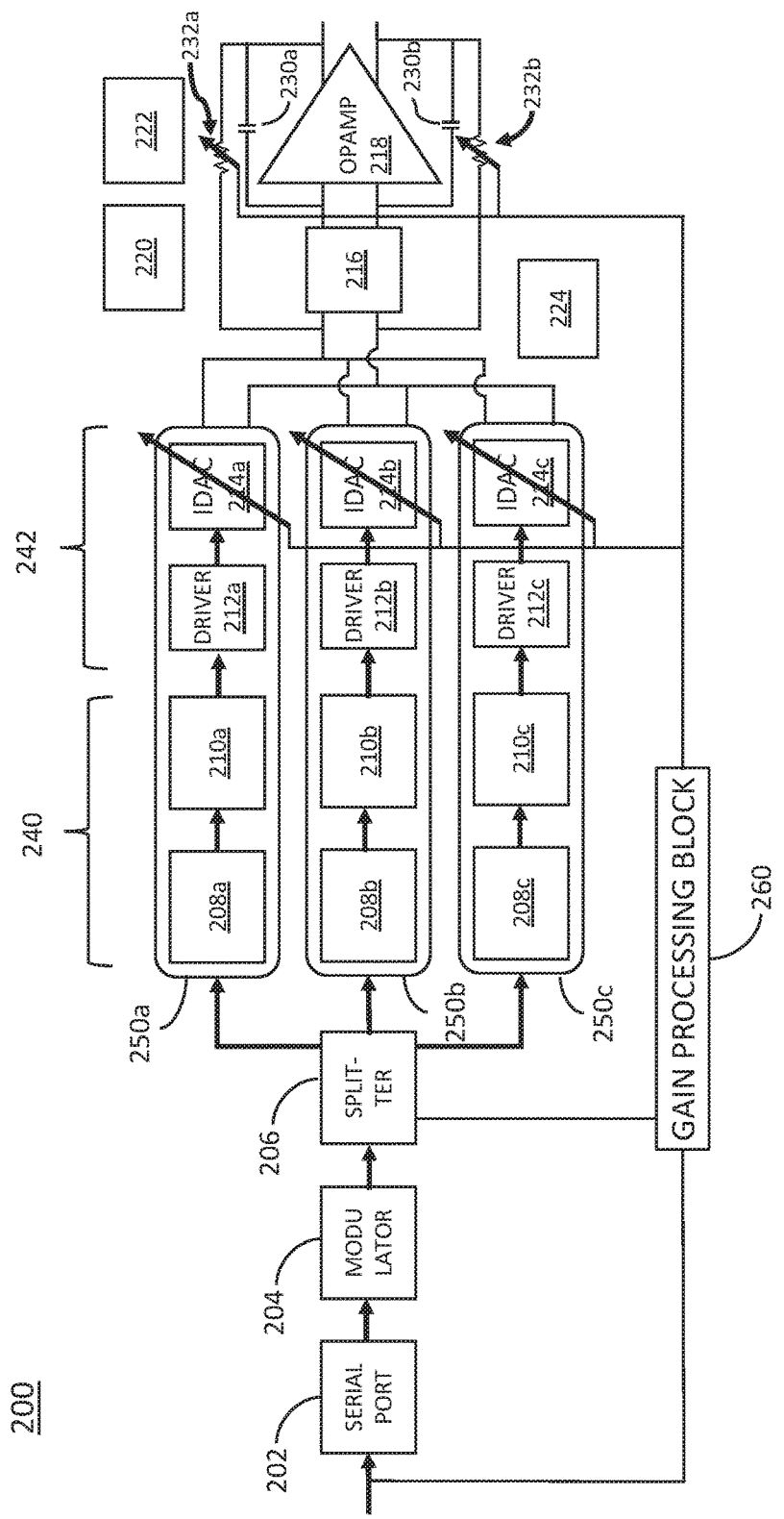
FIG. 2 depicts another example playback path architecture, according to various embodiments of the disclosure.

FIG. 2 depicts another example playback path architecture 200, according to various embodiments of the disclosure. Like the audio playback path architecture 100, the audio playback path architecture 200 includes a serial port and interpolator 202, a modulator 204, and a noise-shaping splitter 106. The audio playback path architecture 200 also includes a gain processing block 260. As described below, the audio playback path architecture 200 increases the current for small signals, thereby improving audio playback performance. According to one implementation, the increase in current for small signals is achieved with the use of a smaller resistor for the current to voltage conversion.

An input signal is input to the serial port and interpolator 202. The input signal is interpolated and input to the modulator 204. In some examples, the modulator 204 is a second order modulator. In some examples, the modulator 204 is an eight bit modulator. The modulator output is input to the noise-shaping splitter 206. The noise shaping splitter 206 splits the signal into three parallel processing lines, and outputs a first sample set to a first line 250a, a second sample set to a second line 250b, and a third sample set to a third line 250c.

Each of the first 250a, second 250b, and third 250c parallel processing lines includes a sign-magnitude conversion element 208a, 208b, 208c, a rotational scrambler 210a, 210b, 210c, an I-DAC driver 212a, 212b, 212c, and a 3-level I-DAC 214a, 214b, 214c. Note that the signal is a digital signal through to the rotational scrambler (section 240), which outputs an analog signal to the I-DAC driver 212a, 212b, 212c. The signal is an analog signal in the next section 242 of the first 250a, second 250b, and third 250c parallel processing lines.

The input signal to each of the I-DACs 214a, 214b, 214c is a representation of current, and, with the use of a resistor, the current is converted to a voltage (current× resistance=output voltage). Decreasing resistance decreases thermal noise of the I-DAC 214a, 214b, 214c. However, when resistance decreases, more current is needed to keep the output voltage constant. For large signals, if resistance is decreased, the current requirements to maintain output voltage would draw a lot power, increasing power consumption of the system, which is undesirable. However, decreasing resistance for small signals, and increasing current to maintain the equivalent output voltage, minimally affects power consumption while significantly improving system performance by decreasing thermal noise. In some examples, current is increased by a factor of 2, a factor of 4, or a factor of 8. In some examples, the current is increased by a factor of another integer.

In various implementations, the I-DACs 214a, 214b, 214c can be any type of DAC, including, for example, a current-steering DAC, a resistive DAC (a voltage domain DAC), and a capacitive DAC (cap-DAC).

The I-DACs 214a, 214b, 214c includes multiple cells, and many of the cells are not in use when incoming signals are small. In one example, an I-DAC would typically use a first resistance and two cells to process a small signal. In this example, to decrease the thermal noise of the I-DAC, the current is doubled such that the I-DAC uses four cells, and the resistance is decreased accordingly to maintain an equivalent output voltage. In some examples, the digital amplitude can be changed to change the gain of the I-DAC 214a, 214b, 214c. A reference voltage is used to generate the currents, and, in some examples, the reference voltage is changed to decrease the thermal noise of the I-DAC 214a, 214b, 214c (instead of changing the number of cells) and the digital amplitude remains the same.

The gain processing block 260 performs a look-ahead function to determine the state of the I-DACs 214a, 214b, 214c. In particular, the gain processing block 260 receives the input signal to the serial port and interpolator 202, and determines for each of the I-DACs 214a, 214b, 214c whether the I-DAC is in a 1×, 2×, 4×, or 8× state, based on the upcoming signals. In one example, when the amplitude of the upcoming signals is small, the gain processing block 260 increases the number of cells used in each I-DAC 214a, 214b, 214c. In some examples, the reference voltage to the IDAC 214a, 214b, 214c is changed to increase or decrease the output current per cell.

The opamp 218 and resistors 232a and 232b constitute a current to voltage converter, which translates the overall current (provided by the current cells in the I-DACs, 214a, 214b, 241c) to an output voltage. The gain processing block 260 is also coupled to the parallel resistors 232a, 232b at the output of the parallel processing lines 250a, 250b, 250c. The gain processing block 260 also changes the resistance of the parallel resistors 232a, 232b based on the size of upcoming signals. For smaller signals, the resistance of the parallel resistors 232a, 232b is decreased, while for larger signals, the resistance of the parallel resistors 232a, 232b is increased.

In one example, for small signals, the gain processing block 260 increases the current by 2× by increasing the number of cells used in an I-DAC 214a, 214b, 214c by two, and reducing the I-V resistance by 2×. These changes can also be done for other gains in the circuit. In various examples, the gain processing block 260 changes the number of cells used in an I-DAC 214a, 214b, 214c by changing the digital amplitude. In various implementations, the gain processing block 260 has a look-ahead feature, as described above, and the signal in the audio playback path is delayed, for example at the modulator 204.

In some implementations, for small signals, the gain processing block 260 increases the current by 2× by increasing the reference voltage to each I-DAC 214a, 214b, 214c. In this example, the number of cells used in each I-DAC 214a, 214b, 214c remains the unchanged and the current is changed by adjusting the reference voltage. Additionally, in this example, the output amplitude remains unchanged.

As described above, the gain processing block 260 adjusts the gain at various points in the playback path architecture 200. In particular, the gain processing block 260 adjusts digital gain (e.g., by determining the number of cells that are active in an I-DAC 214a, 214b, 214c, or by changing the reference voltage to an I-DAC 214a, 214b, 214c to adjust the individual current value). The analog gain is then adjusted to correspond to the digital gain, based on the current-voltage resistance value. Additionally, in this example, the output amplitude remains unchanged.

Figure 3:
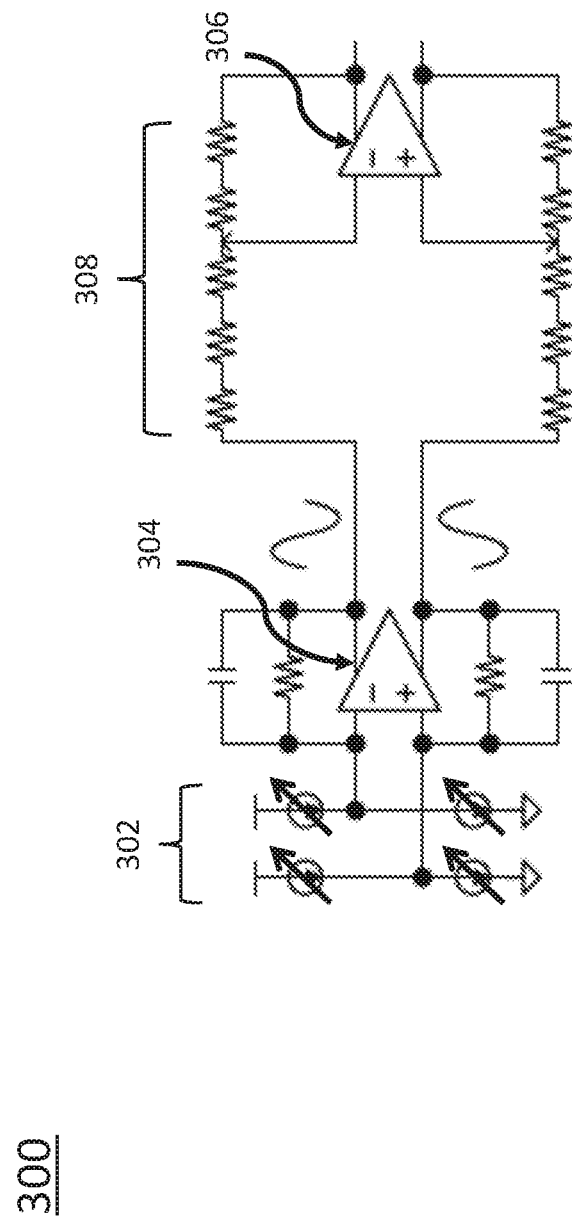
FIG. 3 shows a diagram for an automatic gain control (AGC) circuit, according to various embodiments of the disclosure.

FIG. 3 shows a diagram for an automatic gain control (AGC) circuit 300, according to various embodiments of the disclosure. The gain control circuit 300 of FIG. 3 includes an input 302, a first amplifier 304, input resistors 308, and a second amplifier 306. In some examples, a digital automatic gain control is canceled by an analog automatic gain control. In some examples, the first amplifier 304 is an operational amplifier in a playback path such as amplifier 218 in the playback path circuit 200, and the amplifier 306 is added after the operational amplifier in a playback path circuit 200. In some examples, the second amplifier 306 is performs analog gain control. In one example, the resistance for the second amplifier 306 is fixed, and different gains are achieved by switching the internal tap point for the amplifier 306 input terminals. This allows the gain setting to be changed while maintaining the overall resistance for all gain settings. Thus, in this example, the overall resistance remains the same independent of the gain settings. In particular, the feedback resistance (R0) and input resistance (R1) are changed for various gain settings, but the value of the total feedback resistance (R0+R1) is fixed. According to various implementations, the gains on the second amplifier 306 are changed to improve the signal to noise ratio for small signals.

In various implementations, automatic gain control (AGC) is used for scaling a signal-to-noise ratio. In the small output (i.e., small signal) example, amplifier noise gain can become small, and DAC noise can be attenuated. In one example, small signal amplifier noise gain is ¼, and DAC SNR is improved by approximately 12 dB. In this example, amplifier noise gain may be considered to be 4 decibels (dB) better. In some examples, there is no gain switch at a low signal level.

Figure 4:
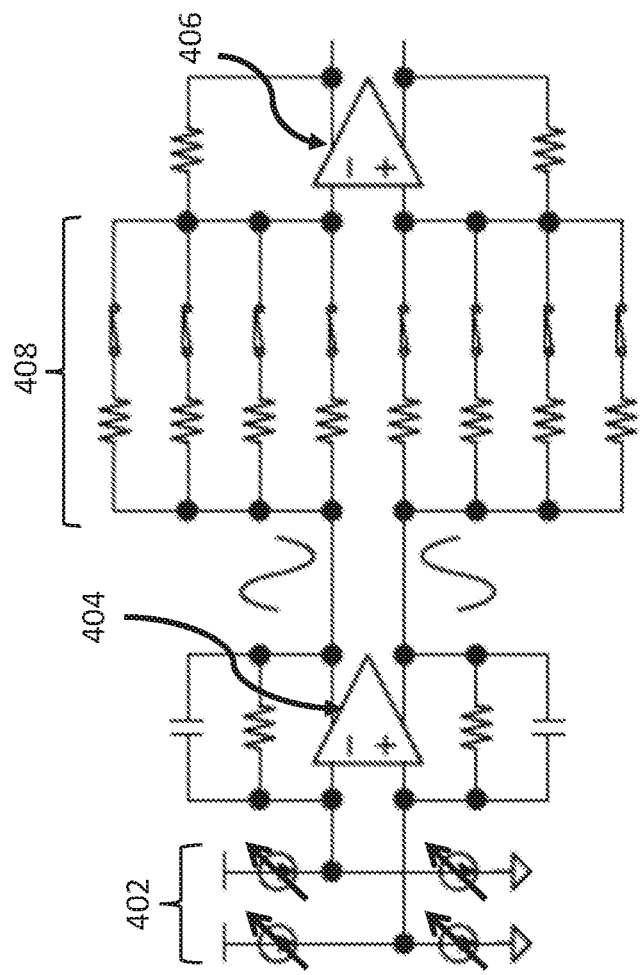
FIG. 4 shows a diagram for an automatic gain control (AGC) circuit 400, according to various embodiments of the disclosure.

FIG. 4 shows a diagram for an automatic gain control (AGC) circuit 400, according to various embodiments of the disclosure. The gain control circuit 400 of FIG. 4 includes an input 402, a first amplifier 404, a second amplifier 406, and an array of parallel resistors 408. In some examples, the first amplifier 404 is an operational amplifier in a playback path such as the amplifier 218 in the playback path circuit 200, and the array of parallel resistors 408 and the amplifier 406 are added after the operational amplifier in a playback path circuit 200. The array of parallel resistors 408 are followed by switches, which allow for the use of one or more of the resistors 408 at a time. Thus, the switches can be used to select resistors and allow for changes in the total input resistance (R1), based on the resistor selection. In some examples, the switches are programmable switches. In some examples, the second amplifier 406 performs analog gain control. In some examples, gain mismatch can be shaped. The gain is changed by switching in parallel resistances to change the equivalent input resistance (R1), while the feedback resistance (R0) remains the same for all gain settings.

Figure 5:
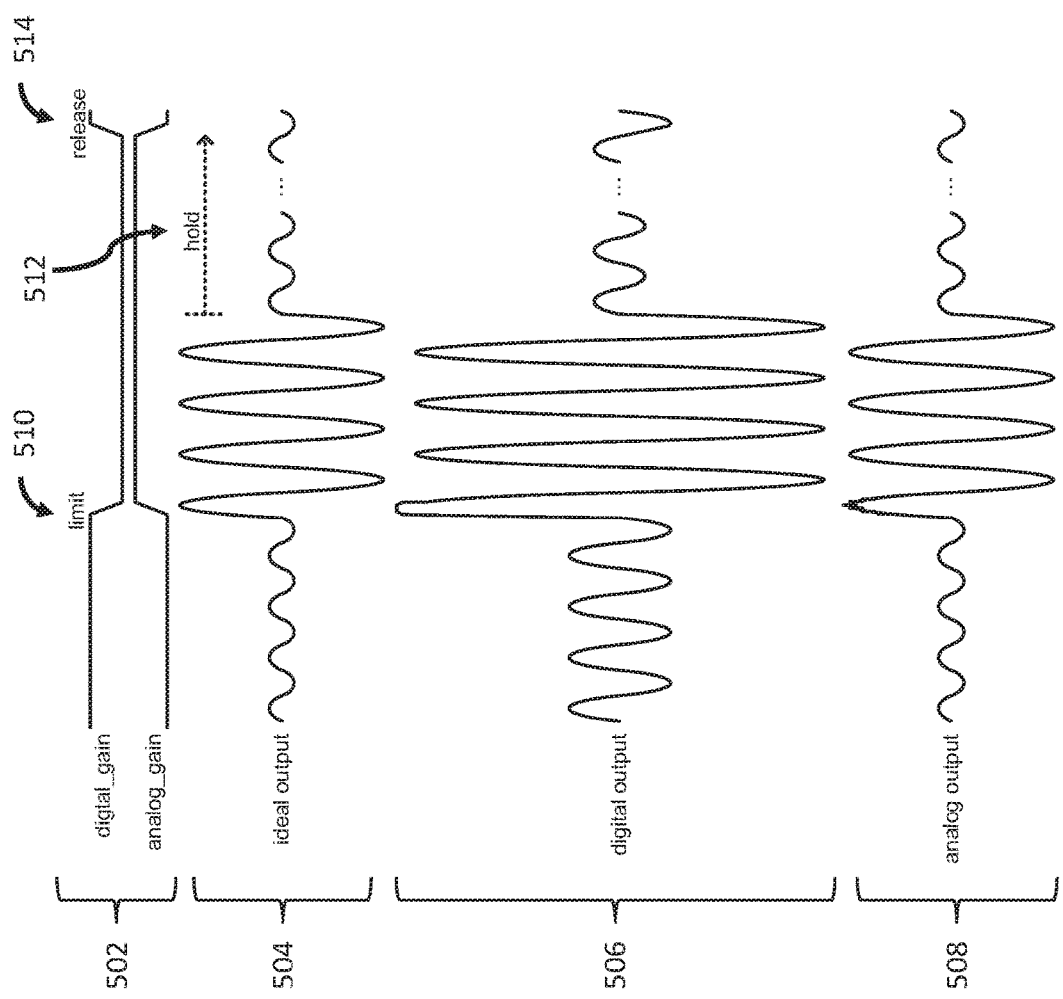
FIG. 5 shows four graphs of signal levels during a playback operation, according to various embodiments of the disclosure.

FIG. 5 shows four graphs of signal levels over time during a playback operation, according to various embodiments of the disclosure. The signal levels begin with a small input signal, and, as shown in the first graph 502, gain is high in the DAC for a small input signal. In particular, digital gain in the DAC is high, while analog gain is low. The second graph 504 shows the desired output. The third graph 506 shows the digital output with the desired gain settings. The fourth graph 508 shows the analog output from the system. Note that the analog output shown in the fourth graph 508 is very close to the desired output shown in the second graph 504.

At the limit mark 510, the input signal increases, and the digital gain is reduced, while the analog gain is increased. Note that by increasing the analog gain when the digital gain is reduced, the overall gain of the system remains constant. As shown in the graphs for desired output 504, digital output 506, and analog output 508, at the limit mark 510, the output signals also increase. In some examples, the transition at the limit mark has a small gain step. In one example, the gain step is on the order of 0.375 dB digital/analog gain step. When the input signal decreases again to a small input signal, the system holds for a period 512 before increasing the digital gain and reducing the analog gain again at the release mark 514. Once the low level signal has been detected for a selected period of time, a recovery operation is performed to increase the digital gain and reduce the analog gain. The recovery operation is performed at a zero-crossing. The "hold" period helps prevent frequent changes in gain due to short changes in the signal.

Figure 6A:
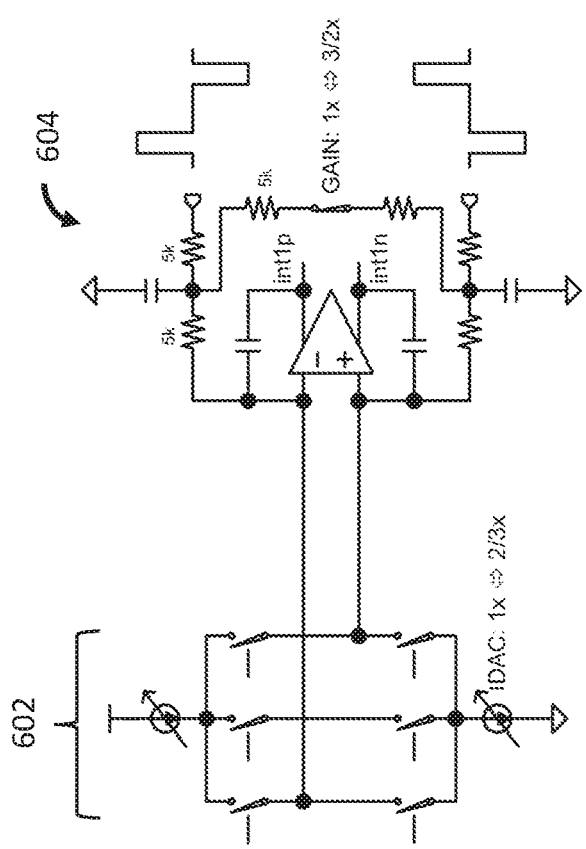
FIGS. 6A and 6B show example circuitry for a class-D modulator, according to various embodiments of the disclosure.
Figure 6B:
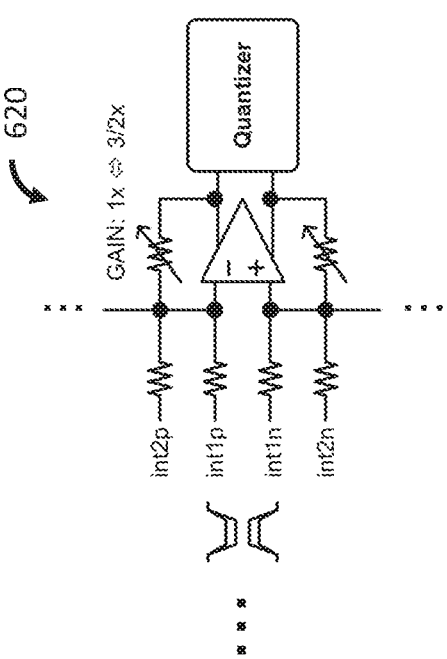

FIGS. 6A and 6B show example circuitry 600 for an input stage of a class-D modulator or an ADC, and the input stage to add signals actively using an operational amplifier, respectively, according to various embodiments of the disclosure. In some examples, the circuitry 600 is used in an integrator. The circuit 600 includes an I-DAC 602. The current feedback signal is output from a class D output stage. When the current in the I-DAC changes, this is countered in the amplifier circuitry 604 on the right. In one example, the I-DAC 602 current is reduced by 2/3 and the feedback resistance in the amplifier circuitry 604 is increased by 3/2. In some examples, an alternate path for the current through the amplifier circuitry 604 takes some of the feedback current, increasing the gain of the I-DAC 602. In various examples, the circuitry 600 shown in FIG. 6A shunts away the current to increase the effective resistance.

The output from the amplifier circuitry 604 is then input into the quantizer circuitry 620 of FIG. 6B. At the quantizer circuitry 620, a shunt gate control can be used to change the feedback gain from 1 to 3/2. In various examples, one of a series resistance and a shunt resistance is changed. In one example, the feedback is changed from 10 k to 15 k by changing the series resistance.

Figure 7:
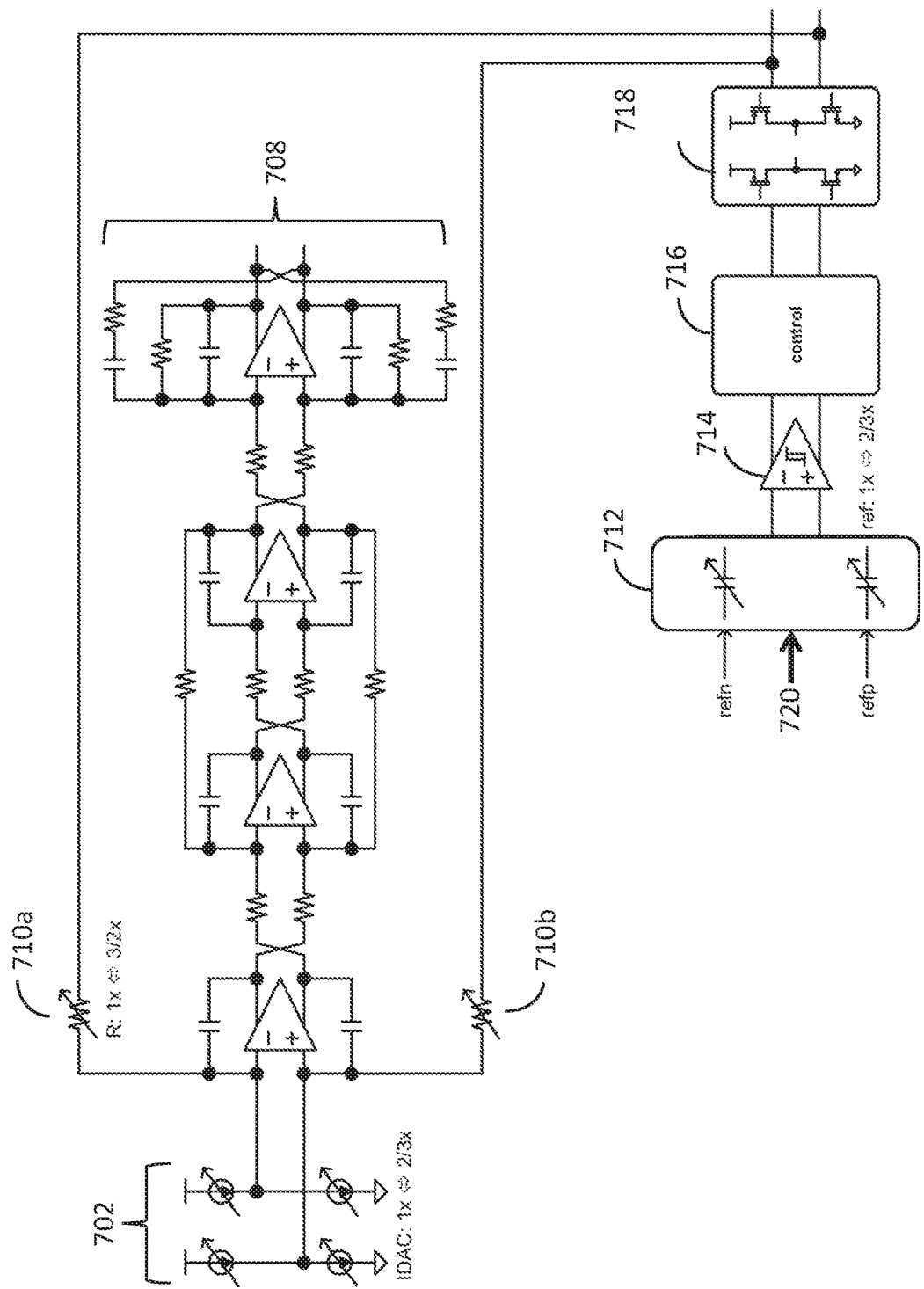
FIG. 7 is a circuit diagram showing circuitry for adjusting the gain in a class D modulator, according to various embodiments of the disclosure.

FIG. 7 is a circuit diagram showing circuitry 700 for adjusting the gain in a class D modulator, according to various embodiments of the disclosure. As shown in FIG. 7, a feedback loop is included such that when resistance at a DAC 702 is decreased, the resistance at the resistors 710a, 710b is increased.

The circuit 700 includes a DAC 702, a loop filter 708, a capacitance module 712, a quantizer 714, a control block 716, and a power stage 718. In some examples, the DAC 702 is a current mode DAC. The output from the power stage 718 is fed back to the loop filter input, and the feedback lines include variable resistors 710a, 710b. The resistance on each of the variable resistors 710a, 710b can be varied to alter the current input. The loop filter 708 output is input to the capacitance module 712 at input 720. Additionally, reference voltages refn and refp are input to the capacitance module 712. The output from the power stage 718 is the circuit 700 output. In some examples, the circuitry 604 from FIG. 6A and the circuitry 620 from FIG. 6B can be combined with the circuitry 700.

Resistance at the resistors 710a, 710b is changed based on changes in resistance at the I-DAC 702. For example, when resistance at the I-DAC 702 is decreased, the resistance at the resistors 710a-710b is increased. In one example, the current at the I-DAC 702 is reduced by 2/3 and the resistance at the resistors 710a, 710b is increased to 3/2. Additionally, the references refp and refn to the quantizer 714 are reduced to maintain the overall state of the output signal from the circuit 700. In various examples, the capacitance module 712 includes capacitors with variable capacitance, which can be used to adjust the references refp and refn to the quantizer 714.

Figure 8:
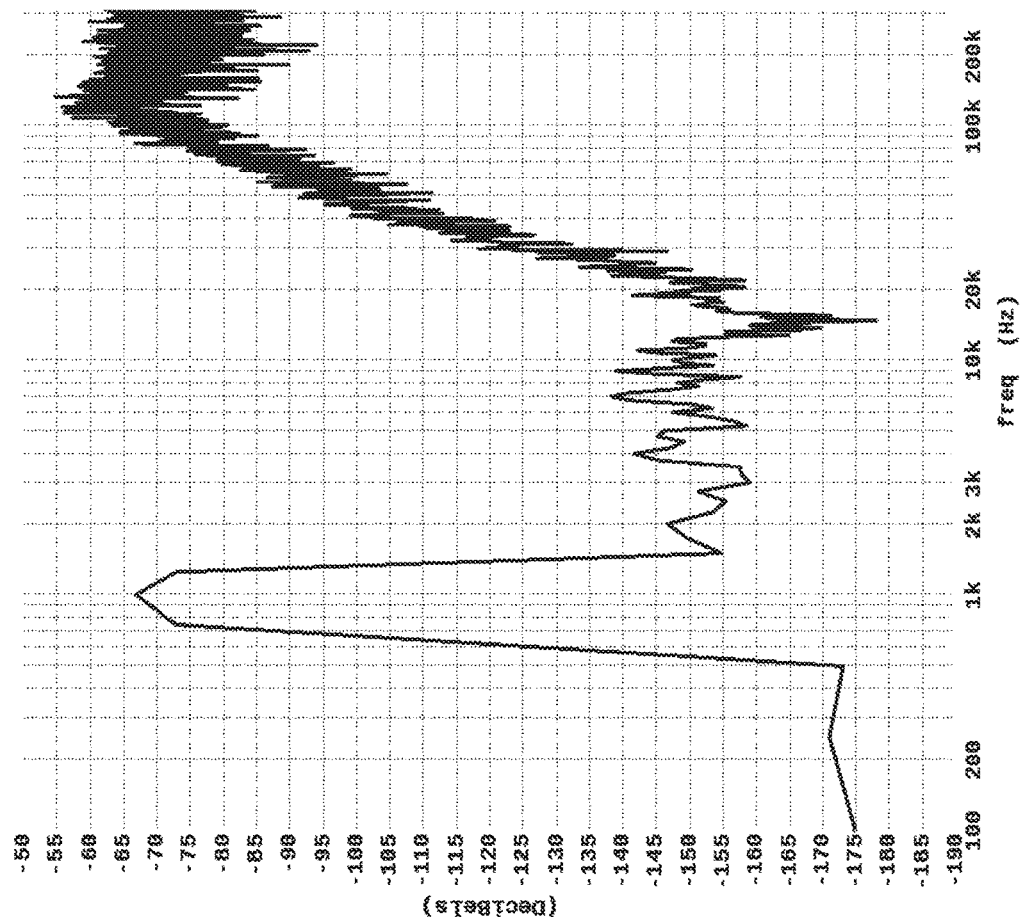
FIG. 8 shows a graph of a Fast Fourier Transform, according to various embodiments of the disclosure.

FIG. 8 shows a graph 800 of a Fast Fourier Transform, according to various embodiments of the disclosure. The graph 800 shows a FFT of the modulator performance in power saving mode. According to various implementations, an FFT of modulator performance in high performance mode yields similar results.

Figure 9:
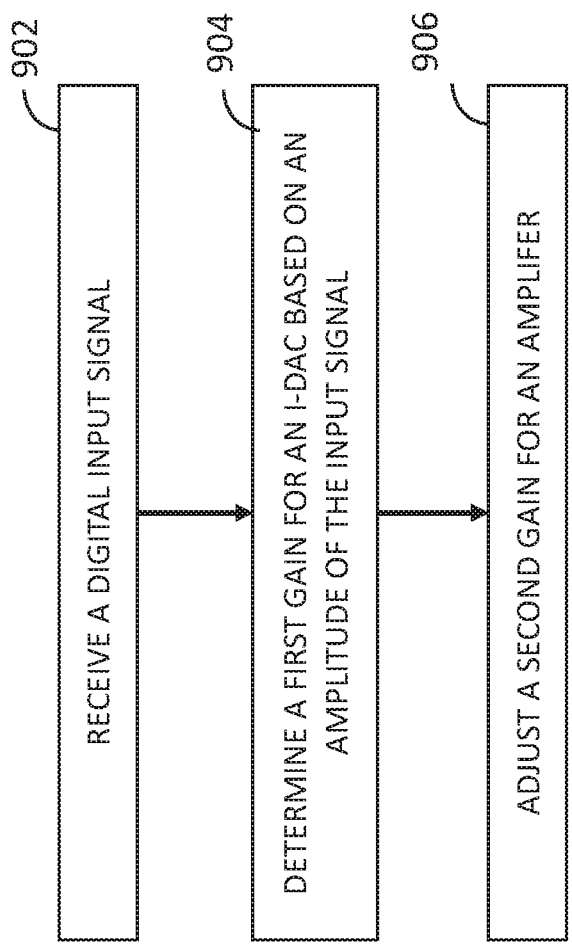
FIG. 9 is a flow chart illustrating a method for a playback path, according to various embodiments.

FIG. 9 is a flow chart illustrating a method 900 for a playback path, according to various embodiments. At step 902, an input signal is received at a playback path input. The input signal is also received at a gain processing module, and, at step 904, the gain processing module determines a gain for an I-DAC based on an amplitude of the input signal. In particular, in some examples, the gain processing module detects a change in the amplitude of the input signal, and adjusts the gain of the I-DAC based on the amplitude change. If the amplitude of the input signal increases, the gain processing module decreases the gain of the I-DAC. If the amplitude of the input signal decreases, the gain processing module increases the gain of the I-DAC. However, before increasing the gain of the I-DAC, the gain processing module maintains the gain for a selected period of time. The hold period prevents frequent changes in gain. In some examples, the gain for the I-DAC is a digital gain.

At step 906, a second gain is adjusted based on the change in gain for the I-DAC. In some examples, the gain of an amplifier downstream from the I-DAC is adjusted. The amplifier can be an inverted amplifier. The second gain is adjusted such that the total gain of the output signal remains the same despite the change in gain at the I-DAC. In some examples, the second gain is an analog gain. In some examples, the input signal is processed through a series of circuitry elements as shown in FIGS. 1 and 2.

Figure 10:
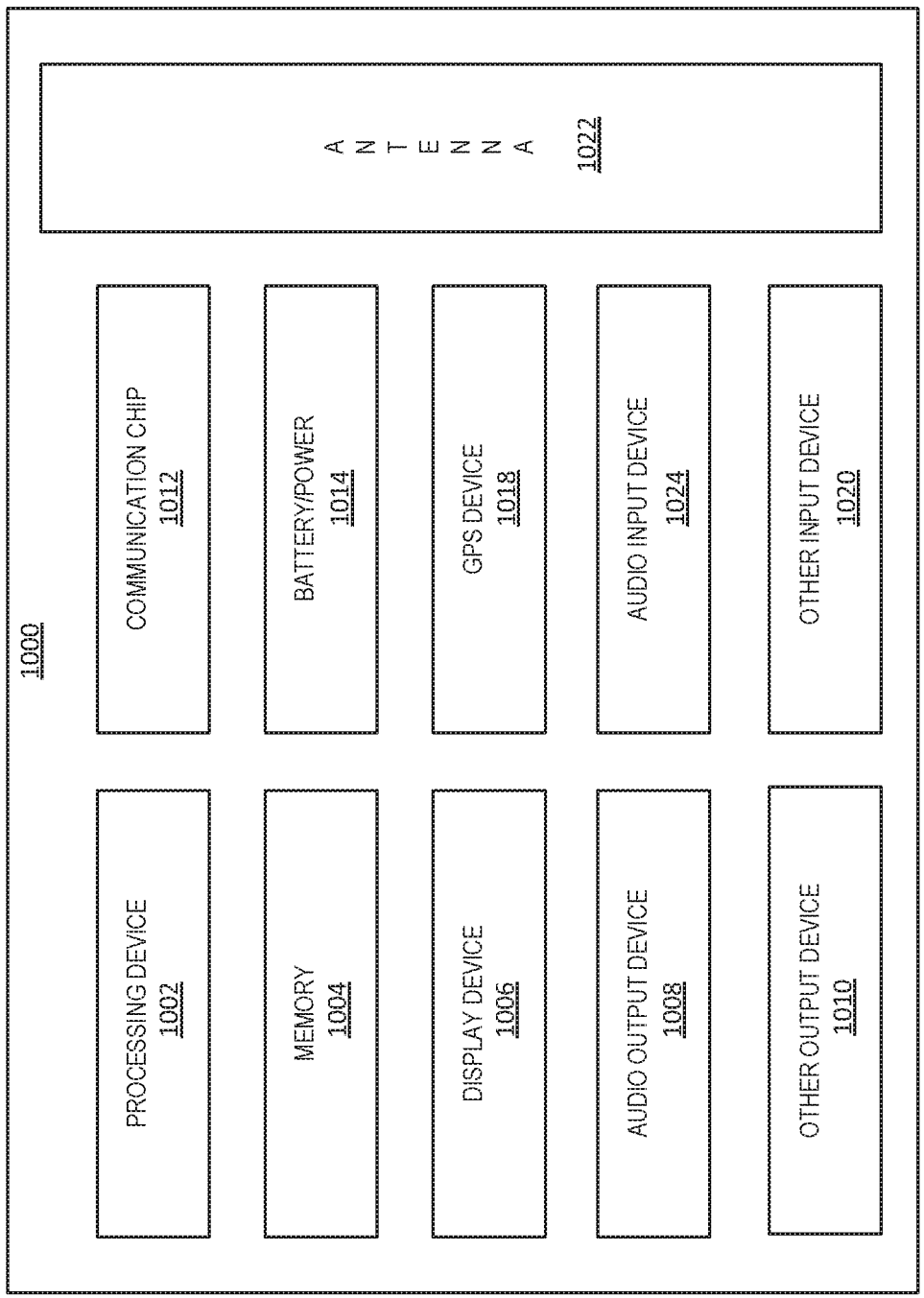
FIG. 10 is a block diagram of an example electrical device that may include one or more class D modulators, in accordance with various embodiments of the disclosure.

FIG. 10 is a block diagram of an example electrical device 1000 that may include one or more digital class D drivers, in accordance with any of the embodiments disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards. In some embodiments, some or all of these components are fabricated onto a single system-on-a-chip (SoC) die.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include a processing device 1002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1000 may include a memory 1004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1004 may include memory that shares a die with the processing device 1002. This memory may be used as cache memory and may include embedded dynamic random access memory (eDRAM) or spin transfer torque magnetic random access memory (STT-MRAM).

In some embodiments, the electrical device 1000 may include a communication chip 1012 (e.g., one or more communication chips). For example, the communication chip 1012 may be configured for managing wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication chip 1012 may manage wired communications, such as electrical, optical, or any other suitable communication protocols (e.g., the Ethernet). As noted above, the communication chip 1012 may include multiple communication chips. For instance, a first communication chip 1012 may be dedicated to shorter-range wireless communications such as Wi-Fi or Bluetooth, and a second communication chip 1012 may be dedicated to longer-range wireless communications such as global positioning system (GPS), EDGE, GPRS, CDMA, WiMAX, LTE, EV-DO, or others. In some embodiments, a first communication chip 1012 may be dedicated to wireless communications, and a second communication chip 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include any visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any device that generates an audible indicator, such as speakers, headsets, or earbuds.

The electrical device 1000 may include an audio input device 1024 (or corresponding interface circuitry, as discussed above). The audio input device 1024 may include any device that generates a signal representative of a sound, such as microphones, microphone arrays, or digital instruments (e.g., instruments having a musical instrument digital interface (MIDI) output).

The electrical device 1000 may include a GPS device 1018 (or corresponding interface circuitry, as discussed above). The GPS device 1018 may be in communication with a satellite-based system and may receive a location of the electrical device 1000, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussed above). Examples of the other input device 1020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1000 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1000 may be any other electronic device that processes data.

SELECT EXAMPLES

Example 1 provides an audio playback circuit, comprising a plurality of current digital-to-analog converters (I-DACs) configured to receive a processed input signal, a plurality of resistors coupled to an output from the plurality of DACs, and a gain processing module configured to determine, based on an input signal, a gain for each of the plurality of DACs and a resistance of each of the plurality of resistors, wherein the input signal is processed to generate the processed input signal Example 2 provides the circuit according to one or more of the preceding and/or following examples, wherein the gain processing module is configured to detect a change in amplitude of the input signal, and wherein the gain processing module is configured to decrease the gain for each of the plurality of I-DACs when an input signal amplitude is large and to increase the gain for each of the plurality of I-DACs when an input signal amplitude is small.

Example 3 provides a circuit according to one or more of the preceding and/or following examples, wherein when a decrease in amplitude is detected, the gain processing module is configured to maintain the gain for each of the plurality of I-DACs for a selected period of time.

Example 4 provides a circuit according to one or more of the preceding and/or following examples, wherein the gain processing module is configured to decrease the resistance of each of the plurality of resistors when the input signal amplitude is small.

Example 5 provides a circuit according to one or more of the preceding and/or following examples, wherein each of the plurality of I-DACs includes a plurality of cells, and wherein the gain processing module increases a number of the plurality of cells that are active in each of the plurality of I-DACs to increase the gain of the plurality of I-DACs.

Example 6 provides a circuit according to one or more of the preceding and/or following examples, wherein each of the plurality of DACs includes a plurality of cells, wherein at least a portion of the plurality of cells is active, and wherein the gain processing module is configured to increase a current for each of the portion of the plurality of cells to increase the gain of the plurality of DACs.

Example 7 provides a circuit according to one or more of the preceding and/or following examples, wherein the gain processing module is configured to adjust a reference voltage to each of the plurality of DACs to adjust the current Example 8 provides a circuit according to one or more of the preceding and/or following examples, further comprising a feedback loop between the plurality of resistors and the plurality of I-DACs.

Example 9 provides a circuit according to one or more of the preceding and/or following examples, further comprising a quantizer coupled to a playback circuit output, wherein the quantizer has a quantizer gain, and the quantizer gain is related to the gain for each of the plurality of I-DACs.

Example 10 provides a circuit according to one or more of the preceding and/or following examples, wherein the gain processing module is further configured to use automatic gain control to adjust the gain for each of the plurality of I-DACs.

Example 11 provides a modulator having an adjustable gain, including a digital-to-analog converter (DAC) configured to receive an input signal and generate an analog signal; a set of resistors coupled to an output from the DAC, wherein each of the set of resistors has a variable resistance, and the resistance of each of the resistors is correlated with the output of the DAC; a loop filter configured to filter the analog signal and output a loop filter output; a summer configured to generate a summed signal based on the loop filter output and a reference voltage, wherein the summer includes a variable capacitor; a quantizer configured to quantize the summed signal; and a power stage configured to generate a modulator output.

Example 12 provides a modulator according to one or more of the preceding and/or following examples, further comprising a set of feedback lines from the modulator output to the loop filter, wherein the set of feedback lines is coupled to the output from the DAC, wherein each of the set of feedback lines includes a respective resistor from the set of resistors.

Example 13 provides a modulator according to one or more of the preceding and/or following examples, wherein, for a first input signal, each resistor of the set of resistors, the reference voltage, and the outputs from the DAC have different values.

Example 14 provides a modulator according to one or more of the preceding and/or following examples, wherein, for the first input signal, the different values are configured to be on different clock cycles.

Example 15 provides a modulator according to one or more of the preceding and/or following examples wherein the DAC is one of a current mode DAC, a voltage mode DAC, and a charge mode DAC.

Example 16 provides a modulator according to one or more of the preceding and/or following examples, further comprising a current shunt coupled to at least one of the DAC and the resistors, wherein the current shunt is configured to shunt the current causing the resistance of each of the resistors to increase.

Example 17 provides a method for processing signals in an audio playback path, comprising receiving an input signal at a playback path input; determining, at a gain processing module, a digital gain for a digital-to-analog converter (DAC) based on an amplitude of the input signal; and adjusting an analog gain for an amplifier based on the digital gain.

Example 18 provides a method according to one or more of the preceding and/or following examples, further comprising detecting a change in the amplitude of the input signal.

Example 19 provides a method according to one or more of the preceding and/or following examples, further comprising decreasing the gain of the DAC when an increase in the amplitude of the input signal is detected; and increasing the gain of the DAC when a decrease in the amplitude of the input signal is detected.

Example 20 provides a method according to one or more of the preceding and/or following examples, further comprising maintaining the gain of the DAC for a selected period of time when the decrease in the amplitude of the input signal is detected.

Example 21 includes an apparatus that includes a playback circuit as discussed or depicted in any of the preceding examples, some other example, or as otherwise discussed or depicted herein.

Example 22 includes an apparatus comprising means to implement a playback circuit as discussed or depicted in any of the preceding examples, some other example, or as otherwise discussed or depicted herein.

Example 23 includes a method for implementing or manufacturing a playback circuit as discussed or depicted in any of the preceding examples, some other example, or as otherwise discussed or depicted herein.

Example 24 includes one or more non-transitory computer-readable media comprising instructions that, upon execution of the instructions by an electronic device, are to cause the electronic device to implement or manufacture a playback circuit as discussed or depicted in any of the preceding examples, some other example, or as otherwise discussed or depicted herein.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous other structures to which the present invention may be applicable, will be readily apparent to those skilled in the art to which the present invention is directed upon review of the present disclosure.

What is claimed is:

1. An audio playback circuit, comprising:
   a plurality of digital-to-analog converters (DACs) configured to receive a processed input signal;
   a plurality of resistors coupled to an output from the plurality of DACs; and
   a gain processing module configured to determine, based on an input signal, a gain for each of the plurality of DACs and a resistance of each of the plurality of resistors, wherein the input signal is processed to generate the processed input signal.

2. The audio playback circuit of claim 1, wherein the gain processing module is configured to detect a change in amplitude of the input signal, and wherein the gain processing module is configured to decrease the gain for each of the plurality of DACs when an input signal amplitude is large and to increase the gain for each of the plurality of DACs when an input signal amplitude is small.

3. The audio playback circuit of claim 2, wherein, when a decrease in amplitude is detected, the gain processing module is configured to maintain the gain for each of the plurality of DACs for a selected period of time.

4. The audio playback circuit of claim 2, wherein the gain processing module is configured to decrease the resistance of each of the plurality of resistors when the input signal amplitude is small.

5. The audio playback circuit of claim 2, wherein each of the plurality of DACs includes a plurality of cells, and wherein the gain processing module is configured to increase a number of the plurality of cells that are active in each of the plurality of DACs to increase the gain of the plurality of DACs.

6. The audio playback circuit of claim 2, wherein each of the plurality of DACs includes a plurality of cells, wherein at least a portion of the plurality of cells is active, and wherein the gain processing module is configured to increase a current for each of the portion of the plurality of cells to increase the gain of the plurality of DACs.

7. The audio playback circuit of claim 6, wherein the gain processing module is configured to adjust a reference voltage to each of the plurality of DACs to adjust the current.

8. The audio playback circuit of claim 1, further comprising a feedback loop between the plurality of resistors and the plurality of DACs.

9. The audio playback circuit of claim 1, further comprising a quantizer coupled to a playback circuit output, wherein the quantizer has a quantizer gain, and the quantizer gain is related to the gain for each of the plurality of DACs.

10. The audio playback circuit of claim 1, wherein the gain processing module is further configured to use automatic gain control to adjust the gain for each of the plurality of DACs.

11. A modulator having an adjustable gain, comprising:
    a digital-to-analog converter (DAC) configured to receive an input signal and generate an analog signal;
    a set of resistors coupled to an output from the DAC, wherein each of the set of resistors has a variable resistance, and the resistance of each of the resistors is correlated with the output of the DAC;
    a loop filter configured to filter the analog signal and output a loop filter output;
    a summer configured to generate a summed signal based on the loop filter output and a reference voltage, wherein the summer includes a variable capacitor;
    a quantizer configured to quantize the summed signal; and
    a power stage configured to generate a modulator output.

12. The modulator of claim 11, further comprising a set of feedback lines from the modulator output to the loop filter, wherein the set of feedback lines is coupled to the output from the DAC, wherein each of the set of feedback lines includes a respective resistor from the set of resistors.

13. The modulator of claim 12, wherein, for a first input signal, each resistor of the set of resistors, the reference voltage, and the outputs from the DAC have different values.

14. The modulator of claim 13, wherein, for the first input signal, the different values are configured to be on different clock cycles.

15. The modulator of claim 11, wherein the DAC is one of a current mode DAC, a voltage mode DAC, and a charge mode DAC.

16. The modulator of claim 11, further comprising a current shunt coupled to at least one of the DAC and the resistors, wherein the current shunt is configured to shunt the current causing the resistance of each of the resistors to increase.

17. A method for processing signals in an audio playback path, comprising:
    receiving an input signal at a playback path input;

determining, at a gain processing module, a digital gain for a digital-to-analog converter (DAC) based on an amplitude of the input signal;

adjusting an analog gain for an amplifier based on the digital gain;

detecting a change in the amplitude of the input signal;

decreasing the gain of the DAC when an increase in the amplitude of the input signal is detected;

increasing the gain of the DAC when a decrease in the amplitude of the input signal is detected; and maintaining the gain of the DAC for a selected period of time when the decrease in the amplitude of the input signal is detected.

18. The method of claim 17, further comprising generating an output signal having an output signal gain based on the digital gain and the analog gain, wherein adjusting the analog gain comprises adjusting the analog gain to maintain a value of the output signal gain.

19. The method of claim 17, further comprising determining, at the gain processing module, a resistance of a resistor based on the amplitude of the input signal.

20. The method of claim 17, wherein increasing the gain includes increasing a number of cells used in the DAC.

\* \* \* \* \*